United States Patent [19]

Kunikiyo et al.

[11] Patent Number: 5,070,469
[45] Date of Patent: Dec. 3, 1991

[54] TOPOGRAPHY SIMULATION METHOD

[75] Inventors: Tatsuya Kunikiyo; Masato Fujinaga; Norihiko Kotani, all of Itami, Japan

[73] Assignee: Mitsubishi Denki Kabushiki Kaisha, Japan

[21] Appl. No.: 410,627

[22] Filed: Sep. 21, 1989

[30] Foreign Application Priority Data

Nov. 29, 1988 [JP] Japan .................... 63-302857
Apr. 19, 1989 [JP] Japan .................... 1-99477

[51] Int. Cl.$^5$ .................................. G06F 15/72
[52] U.S. Cl. ............................ 364/578; 364/488
[58] Field of Search ........ 364/578, 521, 522, 488–491; 371/27

[56] References Cited

U.S. PATENT DOCUMENTS

| | | | |
|---|---|---|---|
| 4,868,770 | 9/1989 | Smith et al. | 364/578 |
| 4,868,771 | 9/1989 | Quick et al. | 364/578 |
| 4,879,667 | 11/1989 | Gorski et al. | 364/578 |
| 4,888,583 | 12/1989 | Ligocki et al. | 364/522 |

OTHER PUBLICATIONS

Shephard: Finite Element Modeling Within an Integrated Geometric Modeling Environment, Part I: Mesh Generation Engineering with Computers. Springer 1985.
Oldham et al., "A General Simulator . . . Lithography", IEEE Transactions of Electron Devices, vol. ED-26, No. 4, Apr. 1979, pp. 717–722.
Hirai et al., "Three Dimensional Process . . . Effects", IEEE Catalogue, Number 87th 0189-01, 1987, pp. 15–16.
Matsuzawa et al., "Three-Dimensionsal Photoresist . . . Surfaces", IEEE Transactions on Electron Devices, vol. Ed-32, No. 9, Sep. 1985, pp. 1781–1783.

Primary Examiner—Salvatore Cangialosi
Attorney, Agent, or Firm—Leydig, Voit & Mayer

[57] ABSTRACT

A topography simulation method for simulating a surface topography of a material object material while a surface of material object is being processed, as by etching or a deposition, includes the steps of dividing a region to be analyzed, in a surface including the advancing direction of processing, into a plurality of regions in a grid in accordance with the surface topography of the material object by approximating the movement of the processed surface of the material object as the movement of an equi-concentration surface determined by the diffusion of particles, establishing diffusion coefficients for the respective regions on the basis of the surface processing velocity, calculating equi-concentration surfaces by the Diffusion equation, and assembling the obtained equi-concentration surfaces to produce a three-dimensional surface topography.

2 Claims, 6 Drawing Sheets

TOPOGRAPHY SIMULATION METHOD

FIELD OF THE INVENTION

The present invention relates to the topography simulation method for simulating the topography of a material object after surface processing, before the production of a semiconductor device. More particularly, the invention relates to a simulation method appropriate for predicting the three-dimensional surface topography being produced, of a region to be processed, of the material object.

BACKGROUND OF THE INVENTION

As a simulation method for simulating surface topography by processing such as etching or a deposition, utilizing an electronic computer, the String Model is well known (refer to "IEEE Trans. Electron Devices, Vol. ED-26, p 1445" by W. G. Oldham).

FIG. 4 shows, in cross-section, a simulation of surface topography in a case of deposition by String Model. In FIG. 4, reference numeral 1 designates a semiconductor substrate on which a material is deposited. Reference numeral 21 designates a point at the substrate surface. Reference numeral 22 designates a segment of the surface of substrate and also of the surface including the advancing deposition. Reference numeral 23 designates the direction in which the deposition is taking place.

In the String Model, by combining the points 21 and the line segments 22, an arbitrary approximating topography is obtained. When the topography changes dependent on the deposition, the movements of the respective line segments 22 are determined at every time interval $\Delta t$ (seconds), and the topography after each interval $\Delta t$ is thus predicted. Then, the length of the line segment 22 is adjusted to be appropriate at every time interval $\Delta t$. When the line segments 22 are about to cross each other, the line segments 22 are adjusted so as not to cross. Thus, the line segment or string that comprises the point 21 and the line segment 22 is controlled.

FIG. 5 shows a conceptual view of string control when the deposition is conducted isotropically. The points 24, 25, and 26 constitute a deposition surface at time $t_i$. The points 24, 25, and 26 are named as point $(j-1)$, point $(j)$, and point $(j+1)$, and the coordinates thereof at time $t_i$ are represented as $(i, j-1)$, $(i, j)$, and $(i, j+1)$, respectively. The point 27 is point $(j)$ at time $t_{i+1}$ which is $\Delta t$ after time $t_i$, and its coordinate is represented by $(i+1, j)$. When the deposition velocity 28 from time $t_i$ to time $t_{i+1}$ is set as $(i, v)$, the relationship between the point 25 and the point 27 is, $$(i+1, j) = (i, j) + (i, v) \times \Delta t$$

Assuming that the vector 29 from point (j) to point $(j-1)$ is represented by $(i, j \to j-1)$ at time $t_i$, the vector 30 from point (j) to point $(j+1)$ is $(i, j \to j+1)$, and the dimension of the vectors 29 and 30 are $|i, j \to j-1|$, $|i, j \to j+1|$, respectively, the direction of the deposition velocity 28 is, $$(i, v) // \frac{|i, j \to j+1| \cdot (i, j \to j-1)}{|i, j \to j-1| \cdot |i, j \to j+1|} + \frac{|i, j \to j-1| \cdot (i, j \to j+1)}{|i, j \to j-1| \cdot |i, j \to j+1|}.$$

Thus, the string is controlled by the above-described formula.

The simulation for etching is similarly executed on the basis of the String Model.

By the way, accompanying the fine patterning of recently developed semiconductor processes, it is necessary to predict the topography of an edge of an element, and a three-dimensional model is required. When the conventional String Model is extended to three dimensions the three-dimensional topography is represented by the surfaces of small triangles. However, to determine the movements of these triangles at every time interval $\Delta t$ and to control the sizes and crossing of the surfaces makes the programming complicated and the calculation time and the memory capacity required are tremendously large. Therefore, it is impossible to realize a three-dimensional simulator.

SUMMARY OF THE INVENTION

It is an object of the present invention to provide a topography simulation method capable of simulating three-dimensional surface topography being produced by surface processing of material object in a short time and with high precision.

Other objects and advantages of the present invention will become apparent from the detailed description given hereinafter; it should be understood, however, that the detailed description and specific embodiment are given by way of illustration only, since various changes and modifications within the spirit and the scope of the invention will become apparent to those skilled in the art from this detailed description.

According to an aspect of the present invention, a topography simulation method comprises the steps of dividing a region to be analyzed into a plurality of regions in a grid in accordance with the constitution and topography surface of the object material by approximating the movement of the processing surface of the material object by the movement of an equi-concentration surface determined by the diffusion of particles, establishing diffusion coefficients for the respective regions on the basis of the surface processing velocity, and calculating equi-concentration surfaces of the respective regions by the diffusion equation and assembling those surfaces to produce a three-dimensional surface.

According to another aspect of the present invention, in a simulation of a deposition utilizing acceleration of the depositing species by an electric field, the surface processing velocity is represented by the intensity of electric field at the surface of the object material, which is obtained by solving the Poisson equation.

By these methods, a high precision simulation result is obtained requiring neither a complicated program nor tremendously long computation time, unlike the three-dimensional String Model. Thus, a practical and general purpose three-dimensional topography simulator is realized.

DETAILED DESCRIPTION OF THE PREFERRED EMBODIMENT

An embodiment of the present invention will be described in detail with reference to the drawings.

Figure 1:
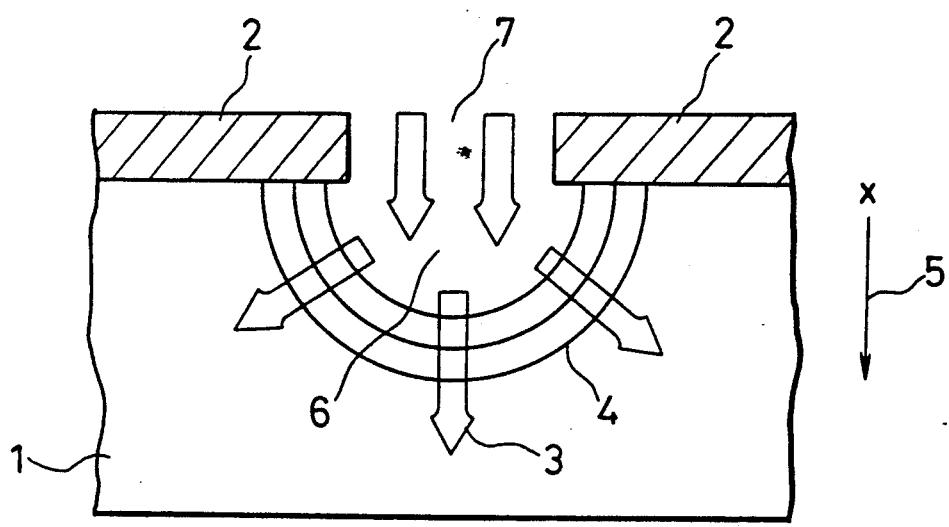
FIG. 1 is a diagram showing, in cross-section, a model simulating etching according to a topography simulation method as a first embodiment of the present invention.

FIG. 1 shows, in cross-section, a simulation model of etching according to a first embodiment of the present invention. In FIG. 1, reference numeral 1 designates a semiconductor substrate which is being etched. Reference numeral 2 designates a mask disposed on the semiconductor substrate 1. Reference numeral 3 designates a flux of etchant for the etching. Reference numeral 4 designates an etching surface (equi-concentration surface). Reference numeral 5 designates the x direction. Reference numeral 6 designates the rear surface of mask 2 and reference numeral 7 designates the front surface of mask 2.

If etching is considered as a phenomenon in which the etching velocity only depends on the flux of etchant due to diffusion, the chemical reaction at the etching front occurs quite rapidly. The mechanism of the etching is modeled as shown in FIG. 1. Herein, it is assumed that the depth direction 5 of the semiconductor substrate 1 is represented by x. At the central portion of the mask window 6, the physical parameters can be approximated as one dimensional. If the flux of etchant $J_x$ is in proportion to the etching velocity $V_x$, the etching velocity $V_x$ is, using a proportional coefficient $\alpha$, related to the flux of etchant $J_x$ by, $$V_x = dx/dt = \alpha J_x. \quad \ldots (1)$$

When the etchant diffuses, keeping the surface concentration of etchant at the mask window 6 constant, the distribution of etchant concentration is one dimensional and is represented by $$C(x, t) = C_0 \mathrm{erfc}(x/2\sqrt{D_x t}), \quad (2)$$

where $C(x, t)$ is etchant concentration distribution, which is a function of depth (distance from the rear surface) x and diffusion time t, $C_0$ is surface concentration at the window, $D_x$ is diffusion coefficient, and erfc is the complementary error function.

The flux of etchant $J_x$ is represented by the following formula, $$\begin{aligned}J_x &= -D_x(\partial C(x, t)/\partial x) \\ &= (D_x C_0/\sqrt{\pi D_x t}) \cdot \exp(-x^2/4D_x t),\end{aligned} \quad (3)$$

therefore, at the surface x=O, $J_x$ becomes $$J_x = C_0 \sqrt{D_x/\pi t} . \quad (4)$$

Next, the movement of the equi-concentration surface 4, i.e., an etching surface, is considered. In formula (2), by establishing that $$C(x,t) = C_1 \text{ (constant)}, \quad \ldots (5)$$

the moving distance in the x direction of the equi-concentration surface 4 is represented as, using the inverse function of complementary error function, $$x = 2\sqrt{D_x t} \; \mathrm{erfc}^{-1}(C_1/C_0). \quad (6)$$

The formula (6) is differentiated with respect to t, to result in $$dx/dt = \sqrt{D_x t} \; \mathrm{erfc}^{-1}(C_1/C_0). \quad (7)$$

After all, the velocity of the equi-concentration surface is in proportion to the etchant flux rate $J_x$ which flows through the mask window 7.

This means that in the diffusion velocity regulated etching, the movement of the etching front is considered to be equivalent to the movement of the equi-concentration diffusion surface.

Next, by defining relationships between the etching velocity and diffusion coefficient and between etching time and diffusion time, an algorithm for simulating various topographies, such as for anisotropic etching or isotropic etching, can be given.

A case where the diffusion time t is varied, for example, from $1^2$ to $8^2$ minutes, that is, $$t - 1^2, 2^2, \ldots, 8^2 \text{ (minutes)},$$

is considered. When the diffusion time t is varied as described above, the equi-concentration surface moves at equal distance intervals as is understood from the formula (6). Accordingly, the correlation between the etching and the diffusion can be formulated as follows, $$V_x = K_1 \sqrt{D_x}, \quad T = K_2 \sqrt{t}, \quad (8)$$

where $V_x$ is etching velocity, T is etching time, $D_x$ is diffusion coefficient, t is diffusion time, and $K_1$, $K_2$ are proportional constants.

By expanding these formulae into three dimensions, the following are obtained, $$V_i = K_1 \sqrt{D_i} \\ T = K_2 \sqrt{t} \\ \partial C/\partial t = -\sum_i (\partial J_i/\partial i) \\ J_i = -D_i (\partial C/\partial i),$$ (9)

where i=x, y, z.

Then, the formula (9) is solved to obtain an equi-concentration surface with constants $K_1$ and $K_2$, etching velocity $V_i$ and etching time t which are appropriately established, resulting in a three-dimensional topography produced by etching. In obtaining this resulting topography, any kind of processing such as anisotropic etching, isotropic etching, or oblique etching can be adopted by varying the values of $V_x$, $V_y$, or $V_z$, correspondingly.

Figure 6:
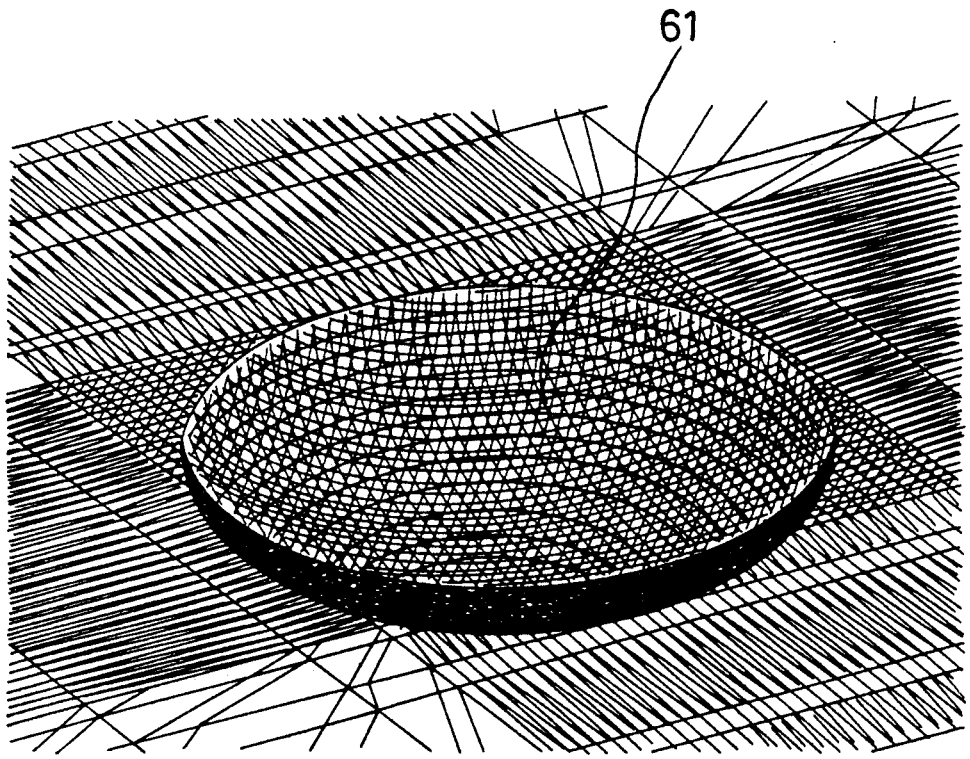
FIG. 6 is a three-dimensional, perspective view showing the simulation result after wet-etching according to the first embodiment of the present invention.
Figure 7:
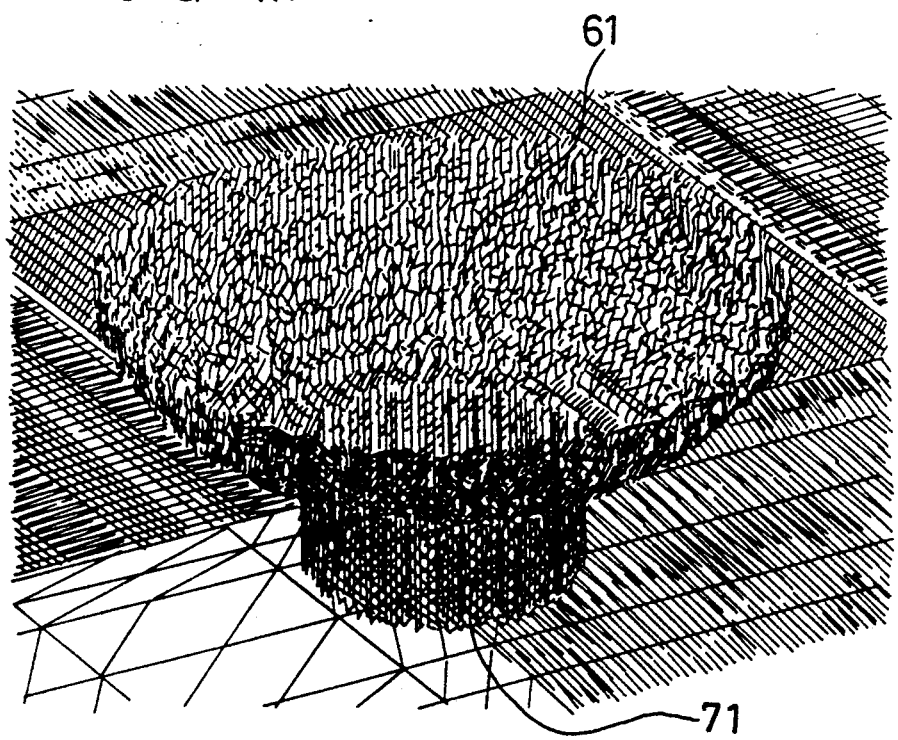
FIG. 7 is a three-dimensional, perspective view showing the result after dry-etching which is carried out after wet etching according to the first embodiment of the present invention.

FIG. 6 shows a simulation of wet etching according to the simulation model of the first embodiment. FIG. 7 shows a simulation of dry-etching which is carried out after the wet-etching. In FIG. 6, reference numeral 61 designates a contact hole of half-spherical shape produced by wet-etching, and in FIG. 7, reference numeral 71 designates a contact through-hole penetrating through the contact hole 61 and produced by dry-etching following the wet-etching.

Figure 2:
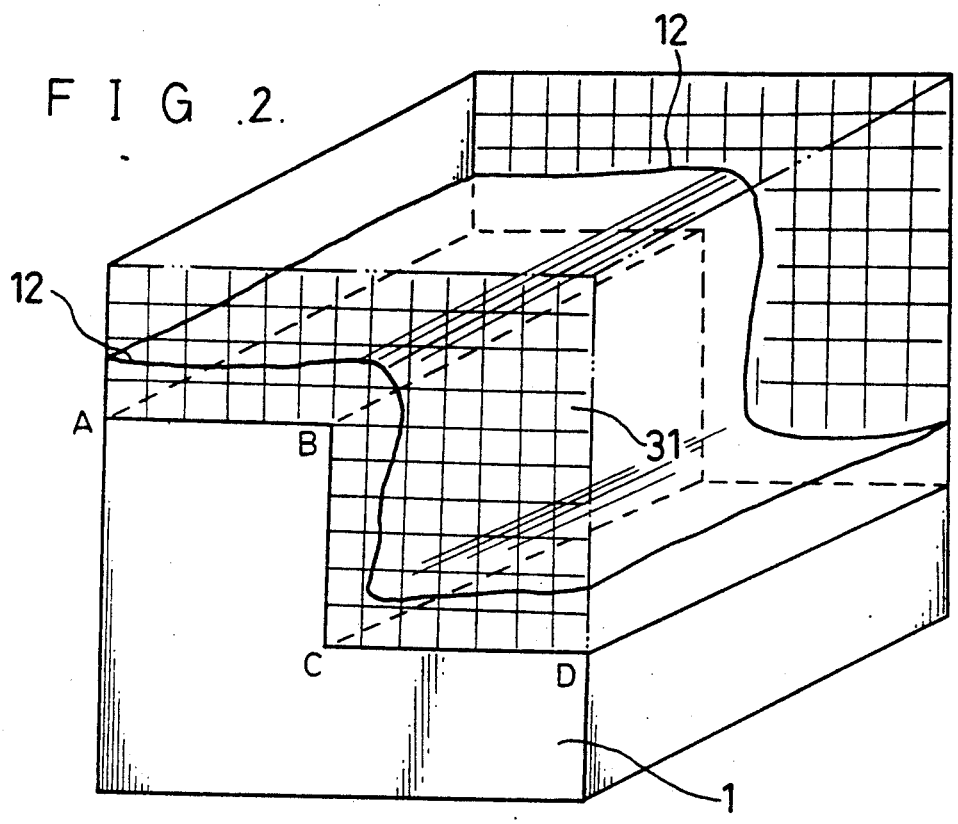
FIG. 2 is a diagram showing a three-dimensional simulation of a deposition according to a topography simulation method as a second embodiment of the present invention.

The simulation method of the present invention can also be applied to material deposition. FIG. 2 shows a simulation model in a case of deposition according to a second embodiment of the present invention. In FIG. 2, reference numeral 1 designates a semiconductor substrate on which material is to be deposited. Reference numeral 12 designates a deposition surface, which is a three-dimensional surface on the substrate 1. Reference numeral 31 designates a region obtained by dividing a surface region to be analyzed, including the advancing direction of deposition, into a grid. The region is divided into grids 31 on the above-described surface, and an equi-concentration surface is obtained by solving the following Diffusion equation. The obtained equi-concentration surface is used as a deposition surface. Thus, a time variation topography of deposition surface is obtained.

$$\frac{\partial C}{\partial t} = D_x \frac{\partial^2 C}{\partial x^2} + D_y \frac{\partial^2 C}{\partial y^2} + D_z \frac{\partial^2 C}{\partial z^2}$$ (10)

$$\sqrt{D_x} = K_1 \cdot V_x, \\ \sqrt{D_y} = K_1 \cdot V_y, \\ \sqrt{D_z} = K_1 \cdot V_z$$ (11)

$$\sqrt{t} = K_2 \cdot T,$$ (12)

where $V_x$, $V_y$, and $V_z$ are x, y, and z components of the deposition velocity V, T is the deposition time, and the boundary conditions are set such that concentration C is constant at initial topography surface (A-B-C-D of FIG. 2). C is equal to 0 at the region to be analyzed, and $K_1$ and $K_2$ are constants of appropriate values.

Figure 3:
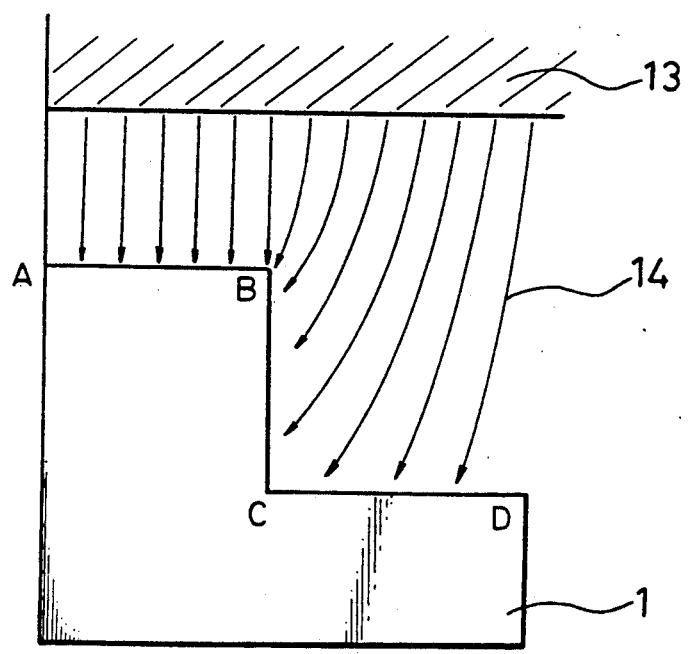
FIG. 3 is a diagram showing a relationship between the distribution of the electric field and the deposition velocity in the simulation model of the second embodiment.
Figure 4:
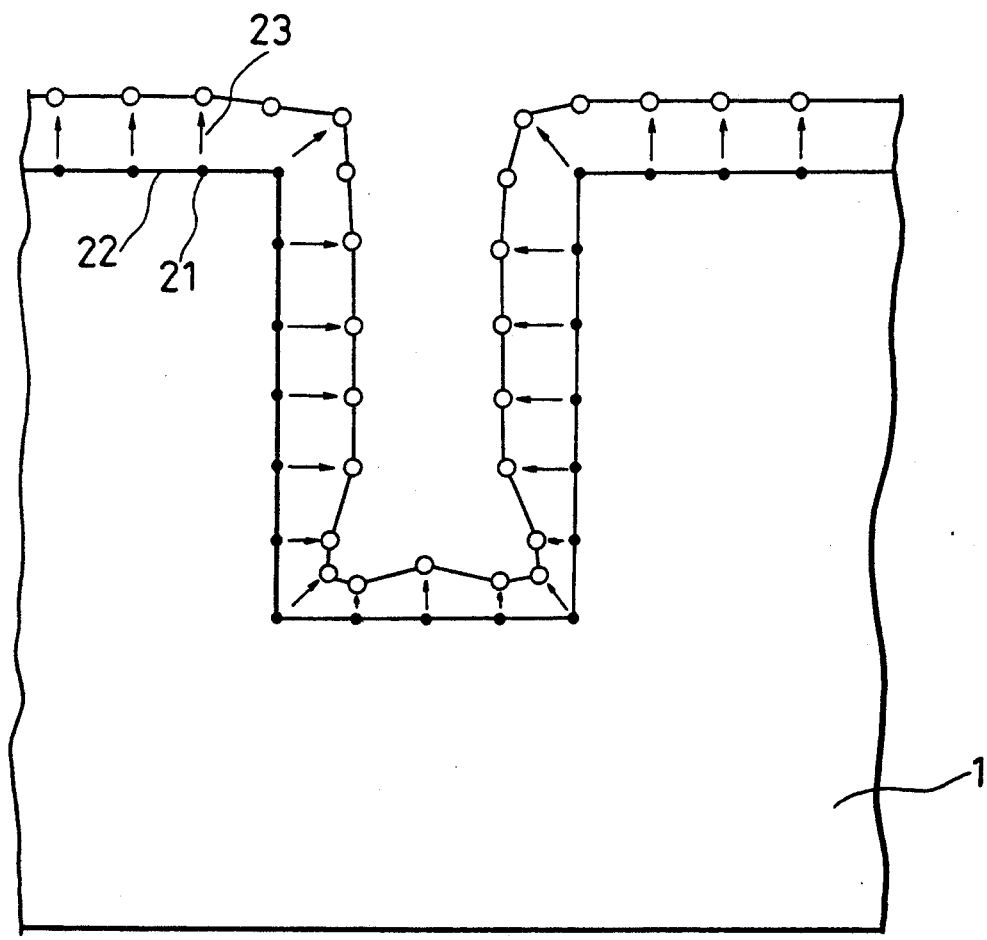
FIG. 4 is a diagram of a simulation according to the conventional String Model.
Figure 5:
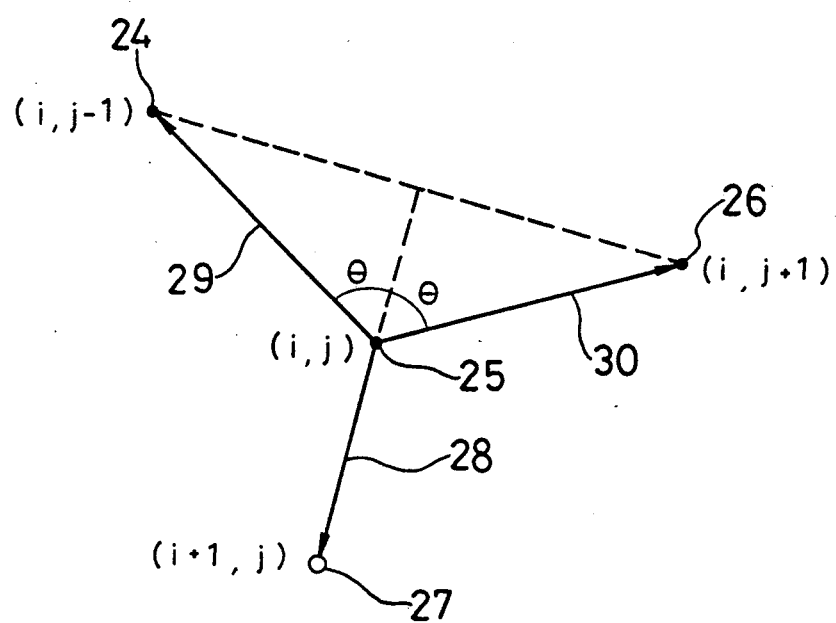
FIG. 5 is a diagram of the conventional String Model.

FIG. 3 shows the relationship between the distribution of the electric field and the deposition velocity in this simulation model. In FIG. 3, reference numeral 13 designates a region where ionized molecules and atoms are distributed in a uniform density. Reference numeral 14 designates an electric line of force which is obtained by solving the following Poisson equation by assigning a voltage $V_E$ ($\neq 0$) to the region 13 and making the substrate 1 be at 0 V, $$\frac{\partial^2 \phi}{\partial x^2} + \frac{\partial^2 \phi}{\partial y^2} + \frac{\partial^2 \phi}{\partial z^2} = \frac{\rho}{\epsilon},$$ (13)

where $\phi$ represents $\phi(x,y,z)$ which is a potential distribution obtained from the relation of E=grad $\phi$(E: electric field), $\rho$ represents $\rho(x,y,z)$, which is an electric charge distribution (in this embodiment $\rho=0$), and $\epsilon$ is permittivity.

Because the ionized molecules and atoms are accelerated along the electric line of force 14, the point B where the intensity of electric field is high has a high deposition velocity and the point C where the intensity of electric field is low has a low deposition velocity.

Accordingly, supposing that the deposition velocity is in proportion to the intensity of the electric field, the velocity components $V_x$, $V_y$, and $V_z$ are related to the intensity of electric field E by $$V_x = (K_3/K_1)E, \\ V_y = (K_3/K_1)E, \\ V_z = (K_3/K_1)E.$$ (14)

Herein, $K_3$ is a constant and when $V_x$, $V_y$, and $V_z$ are equal to each other, the deposition is isotropic. When the equations 14 are rewritten for the $K_3$, the following equations are obtained.

$$K_3 = (K_1/E)V_x, \\ K_3 = (K_1/E)V_y, \\ K_3 = (K_1/E)V_z.$$ (15)

From the above, the relationship between the diffusion coefficient and the electric field intensity is obtained as in the following from the relationship between the diffusion coefficient and deposition velocity represented by the formula (11), $$\sqrt{D_x} = K_3 \cdot E, \\ \sqrt{D_y} = K_3 \cdot E, \\ \sqrt{D_z} = K_3 \cdot E.$$ (16)

Figure 8:
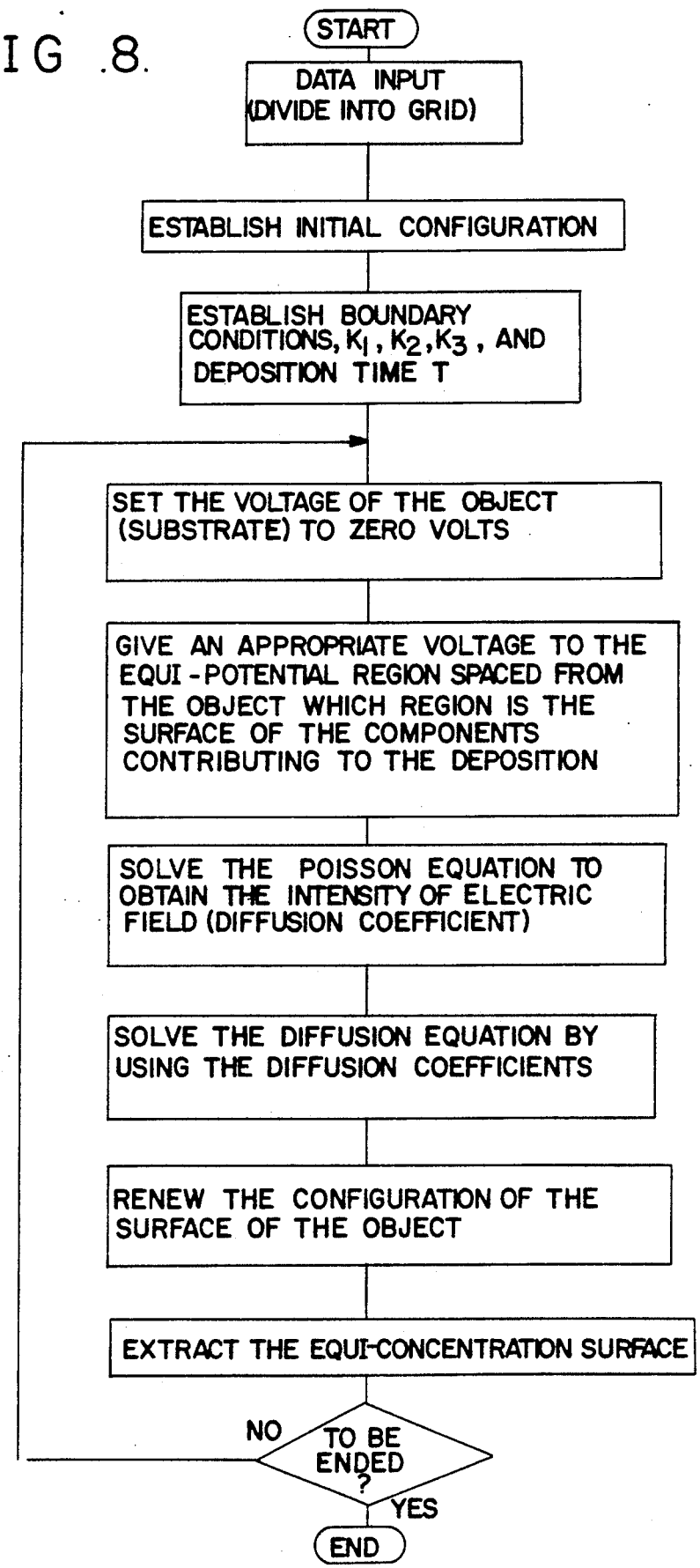
FIG. 8 is a flowchart for a simulation of a deposition according to a second embodiment of the present invention.

FIG. 8 is a flowchart of the simulation model for a deposition process according to a second embodiment of the present invention.

As described above, a deposition is modeled as a diffusion phenomenon in which the components contributing to the deposition diffuse to a semiconductor substrate and the equi-potential surfaces are obtained from the three-dimensional Diffusion equation. These equi-concentration surfaces become the principal deposition surfaces. That is the distribution of the electric field at the surface of the object material is obtained by solving the Poisson equation. The diffusion coefficients for the respective regions are determined from the electric field by establishing constants $K_1$, $K_2$, and $K_3$ and deposition time t as process conditions, and the Diffusion equation is solved to obtain an equi-concentration surface of a deposition surface. In this way, a simulation of a deposition process utilizing electrical field acceleration of particles such as in plasma CVD, which traces the surface topography being processed, is realized in a short time and with high precision.

While in the above-described embodiment a deposition utilizing electric field acceleration is described, the present invention can be applied to a deposition not utilizing acceleration of particles by an electric field. In such case, the use of a formula corresponding to the Poisson equation for obtaining the electric field is unnecessary.

Furthermore, the use of a formula corresponding to the Poisson equation for obtaining the distribution of electric field can be simply used to analyze the movements of depositing particles.

The topography simulation method of the present invention thus described can be effectively utilized in the production process of semiconductor devices, by predicting the results of further processing and/or including the results of past processing based on the simulation result during the production process or between process steps.

As is evident from the foregoing description, according to the present invention, the movement of the surface of a material object being processed is calculated as the movement of the equi-concentration surface determined by the diffusion of particles. The region to be analyzed is divided into a plurality of regions in a grid in accordance with the construction and surface topography of the material object. The diffusion coefficients are established for the respective regions on the basis of the surface processing velocity, and equi-concentration surfaces are calculated from the three-dimensional Diffusion equation. Thus, the three-dimensional surface topography is constructed by assembling the equi-concentration surfaces of the respective regions. Therefore, a high precision simulation for tracing the surface topography being processed can be realized, requiring neither complicated programming nor tremendously large computation time. Thus, a practical and general purpose three-dimensional topography simulator can be realized.

What is claimed is:

1. A method of predicting the three-dimensional shape of a surface of a workpiece on which a material is deposited by the transport of a material deposition species from a source to the surface of the workpiece in a deposition process comprising:

establishing a three-dimensional grid of points;

specifying an initial three-dimensional shape of a surface of a workpiece on which a material will be deposited at each point on the grid of points;

specifying the three-dimensional diffusion coefficient of the material deposition species that will be transported from a source to the surface of the workpiece;

specifying the initial concentration of the deposition species at the surface of the workpiece on which the material will be deposited;

specifying the time T during which the material will be deposited on the workpiece; and successively solving the three-dimensional diffusion model equations for each of a plurality of time intervals representing deposition of the material on the workpiece beginning from the specified initial three-dimensional shape of the surface of the workpiece at the beginning of the first interval, the initial deposition species concentration, and the three-dimensional diffusion coefficient of the deposition species at each point on the grid of points to determine the shape of the surface of the workpiece on which the material is deposited at the end of each interval from the shape of the surface of the workpiece on which the material is deposited at the beginning of that interval until the total length of the time intervals reaches the specified time T, thereby producing the final shape of the deposited surface after the deposition process has continued for the time T.

2. A method of predicting the three-dimensional shape of a surface of a workpiece on which a material is deposited by the transport of a material deposition species from a source to the surface of the workpiece in a deposition process comprising:

establishing a three-dimensional grid of points;

specifying an initial three-dimensional shape of a surface of a workpiece on which a material will be deposited at each point on the grid of points;

specifying the initial concentration of the deposition species at the surface of the workpiece on which the material will be deposited;

specifying the time T during which the material will be deposited on the workpiece;

specifying a voltage difference between a region which is the source of the deposition species and the workpiece;

successively calculating the electric field intensity distribution between the region and the surface of the workpiece on which the material is deposited by solving the Poisson equation for each of a plurality of time intervals representing deposition of the material on the workpiece beginning from the specified initial three-dimensional shape of the surface of the workpiece at the beginning of the first interval and continuing until the total length of the time intervals reaches the specified time T;

successively calculating the three-dimensional diffusion constant of the deposition species between the source and the workpiece assuming the diffusion constant is proportional to the square of the electric field intensity; and successively solving the three-dimensional diffusion model equations for each of the plurality of time intervals representing deposition of the material on the workpiece beginning from the specified initial three-dimensional shape of the surface of the workpiece at the beginning of the first interval, the initial deposition species concentration, and the three-dimensional diffusion coefficient of the deposition species at each point on the grid of points to determine the shape of the surface of the workpiece on which the material is deposited at the end of each interval from the shape of the surface of the workpiece on which the material is deposited at the beginning of that interval until the total length of the time intervals reaches the specified time T, thereby producing the final shape of the deposited surface after the deposition process has continued for the time T.

* * * * *